United States Patent [19]

Alphonse

[11] Patent Number: 4,789,881
[45] Date of Patent: Dec. 6, 1988

[54] LOW COHERENCE OPTICAL SYSTEM HAVING REFLECTIVE MEANS

[75] Inventor: Gerard A. Alphonse, Mercer County, N.J.

[73] Assignee: General Electric Company, Schenectady, N.Y.

[21] Appl. No.: 40,978

[22] Filed: Apr. 20, 1987

[51] Int. Cl.$^4$ .......................... H01L 33/00; H01S 3/19
[52] U.S. Cl. ........................................ 357/17; 330/4.3; 372/44; 372/92
[58] Field of Search ...................... 357/17; 372/92, 44; 330/4.3

[56] References Cited

U.S. PATENT DOCUMENTS

| | | | |
|---|---|---|---|
| 4,251,780 | 2/1981 | Scifres et al. | 331/94.5 |
| 4,432,091 | 2/1984 | Kuroda et al. | 372/45 |

FOREIGN PATENT DOCUMENTS

| | | | |
|---|---|---|---|
| 0088888 | 5/1984 | Japan | 372/92 |

OTHER PUBLICATIONS

E. Mohn et al., "Operation of a Gallium Arsenide Diode Using a Brewster Window", *Physics Letters*, vol. 24A, No. 11, 22 May 1967, pp. 561–562.
Hardy et al., "Tunable Solid State Laser", *IBM Technical Disclosure Bulletin*, vol. 6, No. 8, Jan. 1964, pp. 66–67.
Wada et al., "A New Chemical Etching Technique for Formation of Cavity Facets of (GaAl) as Lasers", *IEEE Journal of Quantum Electronics*, vol. QE-21, No. 6, Jun. 1985, pp. 658–662.
L. N. Kurbatov et al., "Investigation of Superluminescence Emitted By a Gallium Arsenide Diode", *Soviet Physics–Semiconductors*, vol. 4, No. 11, May 1971, pp. 1739–1744.
W. Heitmann, "Reactively Evaporated Films of Scandia and Yttria", *Applied Optics*, vol. 12, No. 2, Feb. 1973, pp. 394–397.
D. R. Kaplan et al., "Exact Calculation of the Reflection Coefficient for Coated Optical Waveguide Devices", *AT&T Bell Laboratories Technical Journal*, vol. 63, No. 6, Jul.–Aug. 1984, pp. 857–877.
M. B. Holbrook et al., "External Cavity Operated Angled Stripe Geometry DH Lasers", *Applied Physics Letter* 36 (5), 1 Mar. 1980, pp. 349–350.
I. Ladany et al., "Scandium Oxide Antireflection Coatings for Superluminescent LEDs", *Applied Optics*, vol. 25, No. 4, 15 Feb. 1986, pp. 472–473.
D. R. Scifres et al., "GaAs/GaAlAs Diode Lasers with Angled Pumping Stripes", *IEEE Journal of Quantum Electronics*, vol. QE-14, No. 4, Apr. 1978, pp. 223–227.
G. A. Alphonse et al., "High-Power Superluminescent Diodes", OSC Conference, Jan. 19–21, 1987.
J. Nieson et al., "High Power 0.83 $\mu$m Angle Stripe Superluminescent Diode", Southwest Optics Conference, Feb. 1987.
G. A. Alphonse, "Superluminescent Diode Development", May 1986.
N. K. Dutta et al., "Optical Properties of a GaAlAs Superluminescent Diode", *IEEE Journal of Quantum Electronics*, vol. QE-19, No. 4, Apr. 1983, pp. 496–498.
I. P. Kaminow et al., "Measurement of the Modal Reflectivity of an Antireflection Coating on a Superluminescent Diode", *IEEE Journal of Quantum Electronics*, vol. QE-19, No. 4, Apr. 1983, pp. 493–495.

*Primary Examiner*—James W. Davie
*Attorney, Agent, or Firm*—William Squire; James C. Davis, Jr.; Paul R. Webb, II

[57] ABSTRACT

An optical system comprises a low coherence light-emitting device and a mirror. The mirror is positioned adjacent an end face of the device such that light emitted from the end face may be redirected back into the device. Radiation having low coherence, which is emitted from an opposing end face, is amplified greatly due to the radiation which reenters the device.

7 Claims, 1 Drawing Sheet

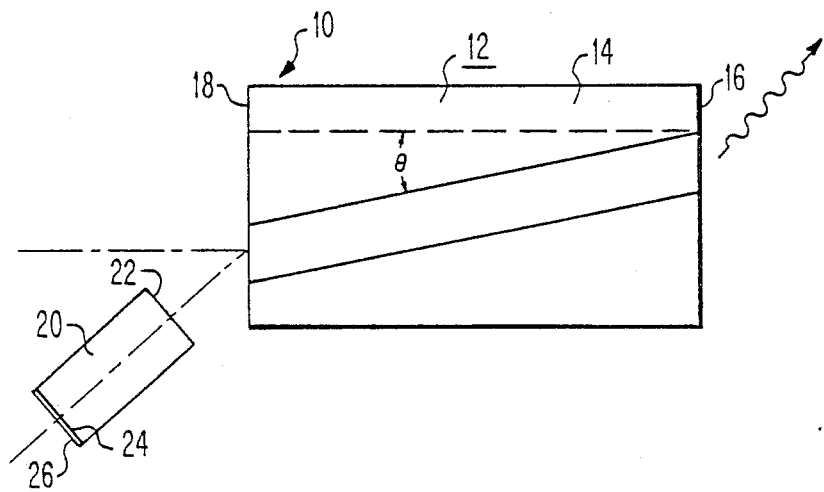

LOW COHERENCE OPTICAL SYSTEM HAVING REFLECTIVE MEANS

The Government has rights in this invention pursuant to a Government Contract.

The invention relates to an optical system in which radiation which is emitted from a low coherence light-emitting device is redirected such that the radiation reenters the device.

BACKGROUND OF THE INVENTION

Radiation emitting devices such as semiconductor lasers typically comprise a body of semiconductor material having opposed end faces in which an active layer is positioned between two cladding regions of opposite conductivity. One of the end faces typically has a reflective coating thereon and the other end face is partially reflective such that radiation produced in the active layer is partially reflected into the semiconductor body by an end face toward the opposing end face, thus forming a resonant cavity. When the current is sufficiently increased above some threshold value, the increase in gain causes lasing action to occur. Lasers emit a narrow band of highly coherent radiation and this coherent radiation may be undesirable in some applications, such as fiber optic gyroscopes.

Superluminescent diodes (SLDs) provide a high power output of broad band low coherent radiation. An SLD typically has a structure similar to that of a laser, with lasing being prevented by antireflection coatings being formed on the end faces. Reflective coatings are typically avoided in these devices since radiation generated within the device will likely be reflected between the end faces resulting in high spectral modulation or lasing action. Spectral modulation is the percentage ratio of the difference between the maximum and minimum power output divided by the sum of the maximum and minimum power output and low spectral modulation is 5% or less modulation. It would be desirable to have an alternative optical system in which the output power of these low coherence light-emitting devices is increased.

SUMMARY OF THE INVENTION

A low coherence optical system comprises a low-coherence light-emitting device which includes a semiconductor body having a pair of end faces. Adjacent one of the end faces is a means for redirecting at least a portion of the radiation emitted from the device so as to reenter the device.

BRIEF DESCRIPTION OF THE DRAWING

The sole FIGURE is a top view of an optical system utilizing the invention.

DETAILED DESCRIPTION OF PREFERRED EMBODIMENTS

As shown in FIG. 1, a low coherence optical system 10 comprises a low coherence light-emitting device 12 having a semiconductor body 14 with first and second opposed end faces, 16 and 18 respectively. Adjacent the second end face 18 is a lens 20, having first and second opposed lens faces 22 and 24 respectively, positioned such that the first lens face 22 is adjacent the second end face 18 of device 12. The second lens face 24 has a mirror coating 26 thereon.

The low coherence light-emitting device is preferably a superluminescent diode (SLD) such as disclosed by Gerard A. Alphonse et al. in a copending U.S. patent application Ser. No. 040,977 entitled "SUPERLUMINESCENT DIODE" or a SLD as disclosed by Gerard A. Alphonse et al. in copending U.S. patent application Ser. No. 040,979 entitled "SUPERLUMINESCENT DIODE AND METHOD OF FORMING SAME both filed concurrently herewith and assigned to the assignee of the present invention." The SLD comprises a body having first and second opposed end faces and sidewalls extending therebetween. The body includes a substrate having a first cladding layer thereon, an active layer overlying the first cladding layer, a second cladding layer overlying the active layer, and a capping layer overlying the second cladding layer. An electrically insulating layer, having an aperture therethrough which extends between the end faces, overlies the capping layer. A means for electrically contacting the body comprises a first electrical contact, which overlies the surface of the substrate opposite the first cladding layer, and a second electrical contact which overlies the capping layer in the aperture. The aperture is inclined at a stripe angle $\theta$ relative to the direction perpendicular to the first and second end faces. The tangent of the stripe angle $\theta$ is greater than or equal to the effective width of the optical beam path in the device divided by the length of the body. Alternatively, the SLD may comprise a semiconductor body having an optical axis extending between a pair of end faces of the body. At least one of the end faces is inclined at an angle relative to a plane perpendicular to the optical axis.

The lens 20 is an optical lens and is preferably a graded index (GRIN) lens. It should be understood that other means for directing radiation into the second end face 18 are equally applicable, including a mirror, or a prism having a mirror coating thereon. The lens 20 has a focal point such that any radiation incident on the first lens face 22 traveling parallel to the axis of the lens 20 will, after refraction, proceed toward the focal point and any ray coming from the focal point will, after refraction, travel parallel to the axis of the lens 20.

The mirror coating 26 is typically composed of aluminum or is a multilayer refractive index coating whose layer thicknesses are chosen for maximum reflectivity. The coating is typically formed by techniques well known in the art such as by standard vacuum deposition techniques. The lens 20 is preferably chosen such that its focal point is at the second lens face 24 and the mirror coating 26 is formed on the second lens face. Alternatively, the mirror coating 26 is preferably formed on a surface adjacent the second lens face 24 at the focal point of the lens 20. Forming the mirror coating 26 at the focal point results in the radiation being redirected into the device 12 in the same pattern in which it was emitted. The lens 20 may also be chosen such that radiation incident on the first lens face 22 will, after refraction, travel parallel to the axis of the lens 20 and the mirror coating is formed on the second lens face 24. Therefore, radiation will be reflected parallel to the axis of the lens 20 toward the light-emitting device 12.

The axis of the lens 20 is preferably inclined at an angle relative to the direction normal to the second end face 18. Typically, this lens angle is equal to the angle of the axis of symmetry of the radiation emitted from the second end face 18. Therefore, radiation which is reflected by the mirror coating 26 is directed into the device 12 along the optical beam path. It should be understood that the position of the mirror coating 26 must be chosen such that no resonant cavity is formed between the first end face 16 and the mirror coating 26. Accordingly, if the light-emitting device is an SLD having an end face inclined at an angle relative to the direction perpendicular to the optical axis, such as disclosed by Gerard A. Alphonse et al. in the aforementioned U.S. patent application Ser. No. 040,979 entitled "SUPERLUMINESCENT DIODE AND METHOD OF FORMING SAME", the mirror may not be positioned adjacent the inclined end face and positioned perpendicular to the optical axis of radiation such that radiation is redirected along the optical path in the device. In this optical system a resonant cavity is formed thereby resulting in lasing action or undesirable high spectral modulation. This problem is avoided if the mirror coating 26 is positioned adjacent the non-inclined end face since radiation reflected by the inclined end face will be absorbed by the semiconductor body and not reflected toward the mirror coating 26.

The light-emitting device 12 and the lens 20 are typically mounted using techniques well known in the art. For example, the light-emitting device 12 may be mounted on a heat sink by soldering and the heat sink may be mounted to a base. A submount is then attached to the base and the lens 20 is properly positioned adjacent the device by monitoring the output of the first end face 16. The lens 20 is then attached to the submount by epoxy or the circumferential surface of the lens 20 may be metallized and then soldered to the submount.

In operation of the optical system, a bias voltage of the proper polarity is applied to the electrical contacts of the device, producing radiation in the active region. Radiation which is emitted from the second end face 24 will be focused by the lens 20 and reflected by the mirror coating 26, thereby redirecting the radiation emitted from the second end face 18 back into the device 12. This radiation reentering the device 12 will be reamplified exponentially since an SLD device may be modeled as an amplifier in which the output is related to an exponential function of the length of the sidewalls and a function of the current density in the device. This reamplified radiation will be emitted from the first end face 16 in the form of low coherent radiation which will have a greatly increased output, far beyond the previous combined emissions from the first and second end faces, 16 and 18 respectively. Therefore, to obtain a desired output, currents applied to the device may be reduced, thus reducing heat dissipation and increasing longevity of the device 12.

I claim:

1. In a low coherence optical system having a low coherence light-emitting device which includes a semiconductor body with an optical path therein and first and second end faces, the improvement comprising:
    means for redirecting radiation positioned adjacent said second end face such that at least a portion of the radiation emitted from said device is redirected so as to reenter the device, said redirecting means being also positioned such that a resonant cavity is not formed between said means for redirecting radiation and said first end face.

2. The optical system of claim 1 wherein said means for redirecting radiation is a mirror.

3. The optical system of claim 1 wherein said means for redirecting radiation is a prism.

4. The optical system of claim 1 wherein said means for redirecting radiation comprises a lens having first and second opposed lens faces wherein said first lens face is adjacent one of said end faces and said mirror is adjacent said second lens face.

5. The optical system of claim 4 wherein said mirror is formed on said second lens face.

6. The optical system of claim 4 wherein said mirror is positioned at about the focal point of said lens.

7. The optical system of claim 4 wherein the lens has an axis and radiation incident on the first lens face will after refraction travel about parallel to said lens axis.

* * * * *